(12) United States Patent
Kusano et al.

(10) Patent No.: US 11,047,917 B2
(45) Date of Patent: Jun. 29, 2021

(54) POWER SUPPLY SYSTEM

(71) Applicant: DENSO CORPORATION, Kariya (JP)

(72) Inventors: Yoshikazu Kusano, Kariya (JP); Koji Ohira, Kariya (JP)

(73) Assignee: DENSO CORPORATION, Kariya (JP)

(*) Notice: Subject to any disclaimer, the term of this patent is extended or adjusted under 35 U.S.C. 154(b) by 85 days.

(21) Appl. No.: 16/558,605

(22) Filed: Sep. 3, 2019

(65) Prior Publication Data
US 2020/0072910 A1 Mar. 5, 2020

(30) Foreign Application Priority Data
Aug. 31, 2018 (JP) .............................. JP2018-163609

(51) Int. Cl.
*G01R 31/392* (2019.01)
*G01R 31/367* (2019.01)

(52) U.S. Cl.
CPC ......... *G01R 31/392* (2019.01); *G01R 31/367* (2019.01)

(58) Field of Classification Search
None
See application file for complete search history.

(56) References Cited

U.S. PATENT DOCUMENTS

2013/0314050 A1* 11/2013 Matsubara ................ H02J 7/00
320/134

FOREIGN PATENT DOCUMENTS

JP 2017-223536 A 12/2017

* cited by examiner

*Primary Examiner* — Jas A Sanghera
(74) *Attorney, Agent, or Firm* — Oliff PLC

(57) ABSTRACT

A power supply system is provided with a secondary battery, a memory unit, a calculation unit and a SOC characteristics acquiring unit. The memory unit stores initial characteristics data having a relationship between the open circuit voltage and the capacity for the secondary battery before being deteriorated. The calculation unit utilizes the initial characteristics data to calculate a deteriorated characteristics data which is a relationship between the open circuit voltage and the capacity of the deteriorated secondary battery. The SOC characteristics acquiring unit acquires the relationship between the open circuit voltage and the state of charge of the deteriorated secondary battery by dividing the capacity value included in the deteriorated characteristics data by the fully charged capacity of the deteriorated secondary battery.

5 Claims, 14 Drawing Sheets

POWER SUPPLY SYSTEM

CROSS-REFERENCE TO RELATED APPLICATION

This application is based on and claims the benefit of priority from earlier Japanese Patent Application No. 2018-163609 filed Aug. 31, 2018, the description of which is incorporated herein by reference.

BACKGROUND

Technical Field

The present disclosure relates to a power supply system that calculates a relationship between an open circuit voltage and a state of charge of a secondary battery.

Description of the Related Art

Conventionally, a power supply system that calculates a relationship between the open circuit voltage and the state of charge is known. In such a power supply system, an open circuit voltage and a state of charge are acquired at plurality times while operating a secondary battery, and acquired data are accumulated to calculate the relationship between the open circuit voltage and the state of charge, as a state of charge characteristics data.

SUMMARY

The present disclosure has been achieved in light of the above-described circumstances and provides a power supply system capable of acquiring the SOC characteristics data.

The present disclosure provides a power supply system including: a secondary battery; a memory unit that stores initial characteristics data; a calculation unit that calculates a deteriorated characteristics data by using the initial characteristics data, and a SOC characteristic acquiring unit that acquires a relationship between an open circuit voltage and a state of charge of the deteriorated secondary.

DETAILED DESCRIPTION OF THE PREFERRED EMBODIMENTS

Figure 1:
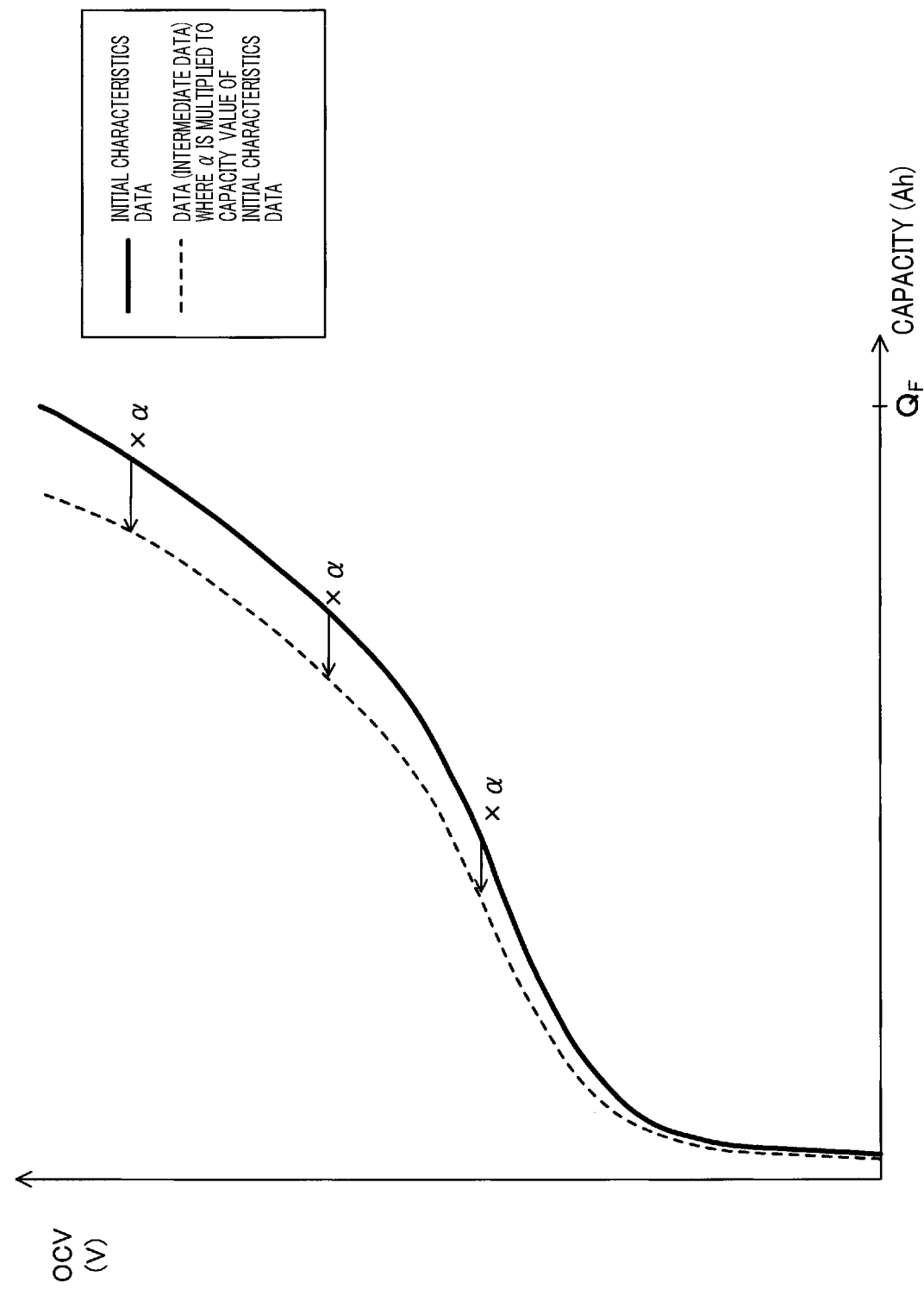
FIG. 1 is a graph showing initial characteristics data and data in which a capacity value of the initial characteristics data is multiplied by a capacity deterioration ratio α according to the first embodiment of the present disclosure.

Conventionally, a power supply system that calculates a relationship between the open circuit voltage and the state of charge is known. For example, JP-A-2017-223536 discloses a power supply system in which an open circuit voltage (hereinafter also referred to as OCV) and a state of charge (hereinafter also referred to as SOC) are acquired at plurality times while operating a secondary battery, and acquired data are accumulated (see FIG. 14) to calculate the relationship between the OCV and the SOC (hereinafter also referred to as SOC characteristics data). Then, the power supply system calculates the SOC of the secondary battery SOC being used by using the SOC characteristics data and the OCV actual measurement data. According to the above-described power supply system, calculated SOC values are utilized for controlling charge/discharge of the secondary battery.

It has been known that the SOC characteristics data changes when the secondary battery is deteriorated. Accordingly, the power supply system regularly updates the SOC characteristics data.

However, the SOC of the secondary battery in use may not reach a value close to 0% or 100%. In this case, it is difficult to acquire the measurement value for when the SOC reaches such values (See FIG. 14). Hence, according to the above-described power supply system, the SOC characteristics data when the SOC is close to 0% or 100%, the SOC characteristics data cannot be acquired accurately. The present disclosure has been achieved in light of the above-described circumstances and provides a power supply system capable of acquiring the SOC characteristics data.

A first aspect of the present disclosure is a power supply system including: a secondary battery; a memory unit that stores initial characteristics data, the initial characteristics data being a relationship between an open circuit voltage and a capacity of the secondary battery before being deteriorated; a calculation unit that calculates a deteriorated characteristics data by using the initial characteristics data, the deteriorated characteristics data being a relationship between the open circuit voltage and the capacity of a deteriorated secondary battery where the secondary battery is being deteriorated; and a SOC characteristic acquiring unit that acquires a relationship between the open circuit voltage and a state of charge of the deteriorated secondary, by dividing the capacity of the deteriorated secondary battery included in the deteriorated characteristics data by a fully charged capacity ($Q_F'$) of the deteriorated secondary battery.

The above-described power supply system includes the calculation unit, and the SOC characteristics acquiring unit.

The calculation unit uses the initial characteristics data to calculate the deteriorated characteristics data. The SOC characteristics acquiring unit acquires a relationship between the OCV and the SOC of the secondary battery (i.e. SOC characteristics data) by using the deteriorated characteristics data. The initial characteristics data can be acquired for the entire SOC range (i.e. 0% to 100% of SOC) before operating the secondary battery. Therefore, the SOC characteristics data is calculated using the initial characteristics data, whereby accurate SOC characteristics data can be acquired for the entire SOC range.

As described, according to the above-described aspect, a power supply system can be provided in which the SOC characteristics data can be accurately acquired for the entire SOC range. Note that reference numerals in parentheses in the claims and the means for solving the problems indicate the corresponding relationship between the specific means described in the following embodiments, and do not limit the technical range of the present invention.

First Embodiment

Figure 3:
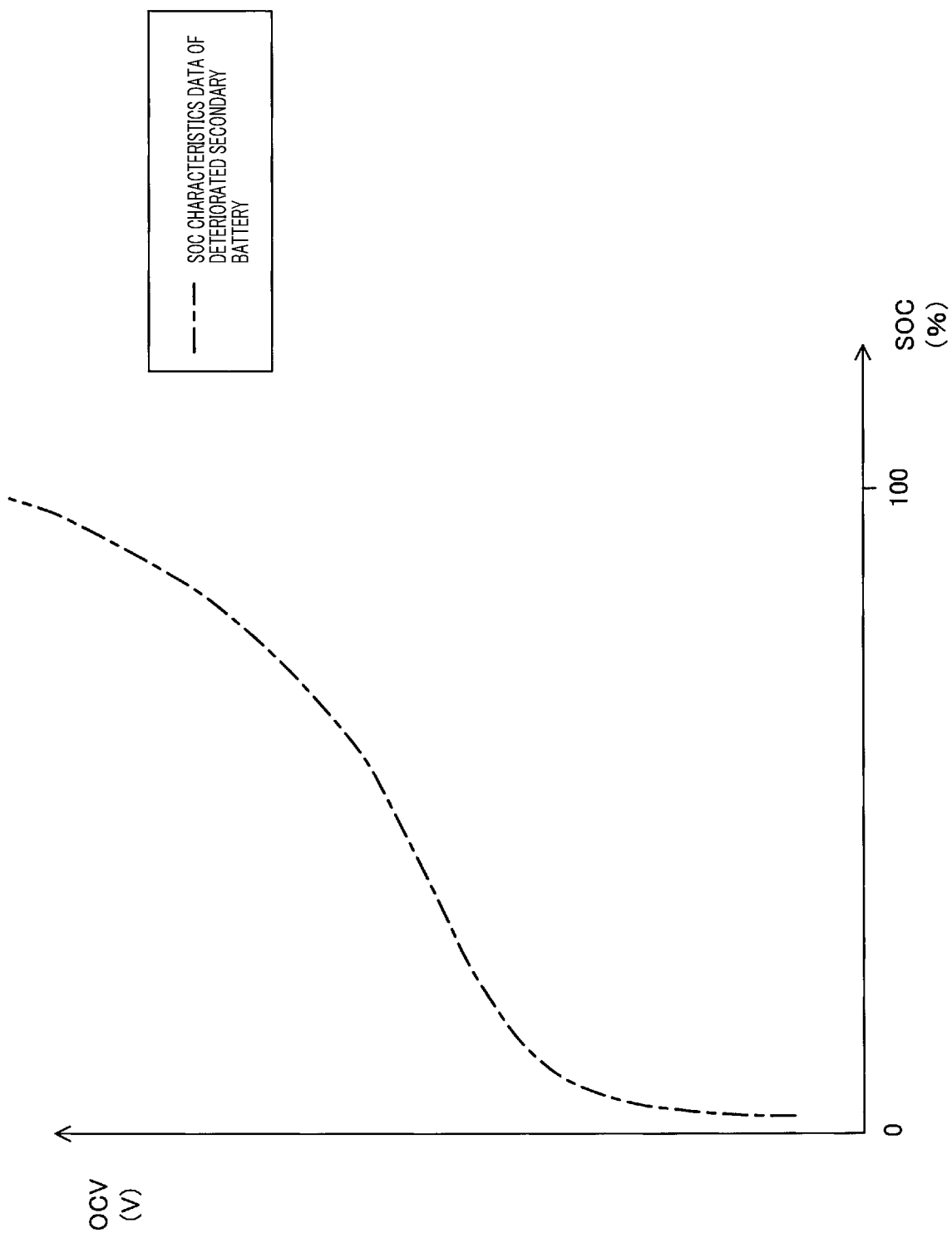
FIG. 3 is a graph showing SOC characteristics data of deteriorated secondary battery according to the first embodiment.
Figure 4:
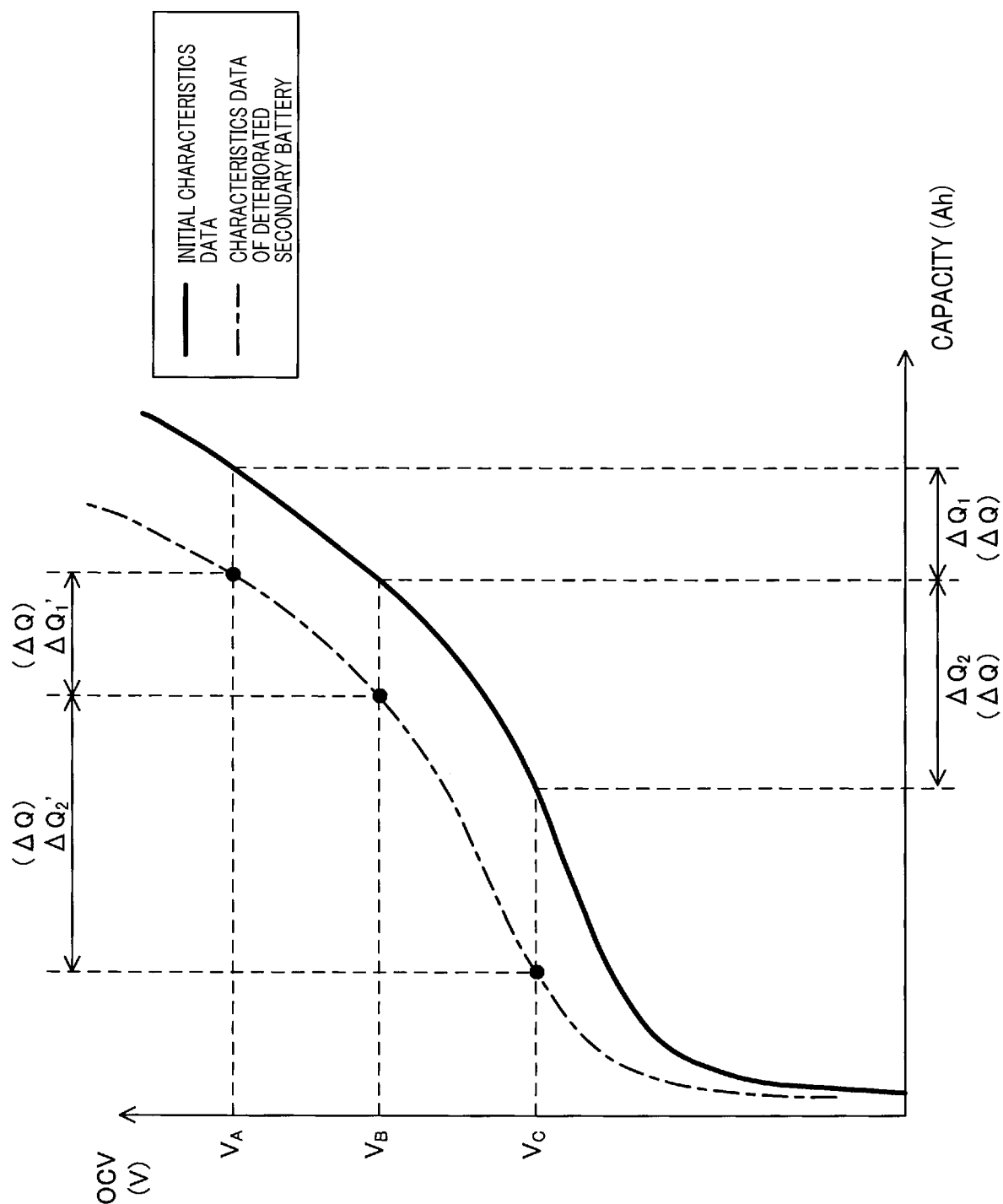
FIG. 4 is a graph explaining a method of calculating the capacity deterioration ratio α and an offset quantity β according to the first embodiment.
Figure 5:
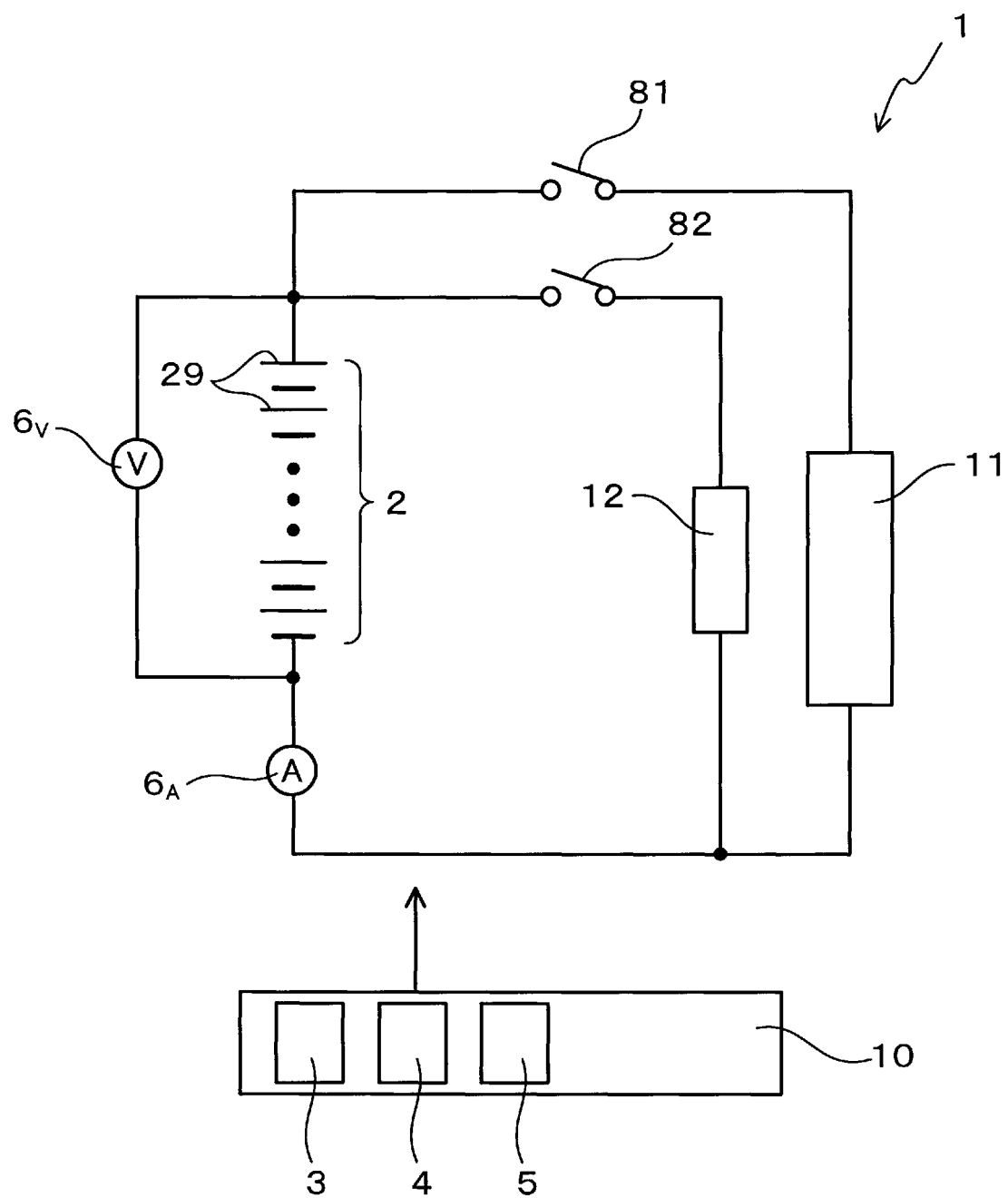
FIG. 5 is a conceptual block diagram showing a power supply apparatus according to the first embodiment.

With reference to FIGS. 1 to 8, an embodiment of the above-mentioned power supply system according to the present disclosure will be described. As shown in FIG. 5, the power supply system 1 of the present embodiment is provided with a secondary battery 2, a memory unit 2, a calculation unit 4, and a SOC characteristics acquiring unit 5. The memory unit 3 stores initial characteristics data (see FIG. 1) showing a relationship between the open circuit voltage (i.e. OCV) and the capacity of a secondary battery 2 before being deteriorated. The calculation unit 4 uses the initial characteristics data to calculate deteriorated characteristics data (see FIG. 2) as a relationship between the OCV and the capacity of the deteriorated secondary battery.

The SOC characteristics acquiring unit 5 acquires the relationship (see FIG. 3) between the OCV and the SOC of the deteriorated secondary battery 2 by dividing the capacitance value included in the deteriorated characteristics data by the fully charged capacity $Q_F'$ of the deteriorated secondary battery 2.

The power supply system 1 according to the present embodiment is an on-vehicle power supply system to be mounted on an electric vehicle or a hybrid vehicle. AS shown in FIG. 5, the secondary battery 2 is connected to an inverter 11 and a charging apparatus 12. The above-mentioned inverter 11 converts the DC power supplied from the secondary battery 2 to the AC power. The AC power converted from the DC power is used to drive a three-phase AC motor (not shown). Thus, the above-described vehicle is driven.

A discharge switch 81 is disposed between the inverter 11 and the secondary battery 2. Further, a charge switch 82 is disposed between the charge apparatus 12 and the secondary battery 2. When driving the inverter 11, the discharge switch 81 is controlled to be ON. When charging the secondary battery 2, the charge switch 82 is controlled to be ON. These ON-OFF operations of the switches 81 and 82 are controlled by the control unit 6. The control unit 6 includes the above-described memory unit 3, the calculation unit 4 and the SOC characteristics acquiring unit 5.

The secondary battery 2 includes a plurality of battery cells 29 which are connected in series. Each battery cell 29 is composed of a lithium-ion battery. A voltage sensor 6v and a current sensor 6A are connected to the secondary battery 2. The measurement values of these sensors 6A and 6v are transmitted to a control unit 10. Note that a plurality of battery cells 29 may be mutually connected in parallel to constitute a cell block, and a plurality of the cell blocks may be mutually connected in series so as to constitute the secondary battery 2.

Next, a method for calculating the relationship between the OCV and the SOC (i.e. SOC characteristics data) of the deteriorated secondary battery 2 will be described. As shown in FIG. 1, after producing the secondary battery 2, the control unit 10 acquires a relationship between the OCV and the capacity of the secondary battery in the initial state (i.e. initial characteristic data). For example, to acquire the initial characteristics data, the secondary battery 2 is fully discharged and slightly charged, and the current accumulation value (i.e. capacity) and the OCV are measured. This measurement is repeatedly performed until the secondary battery 2 is fully charged. The acquired plurality of measurement values are stored into the memory unit 3 as the above-described initial characteristics data.

In the case where the secondary battery 2 is deteriorated, the calculation unit 4 generates data (hereinafter also referred to as intermediate data) in which the capacitance value of the initial characteristics data is multiplied by the capacity deterioration ratio α. The capacity deterioration ratio α can be expressed in the following equation, where the fully charged capacity of the deteriorated secondary battery 2 is $Q_F'$, and fully charged capacity before being deteriorated is $Q_F$.

$$\alpha = Q_F'/Q_F$$

Figure 2:
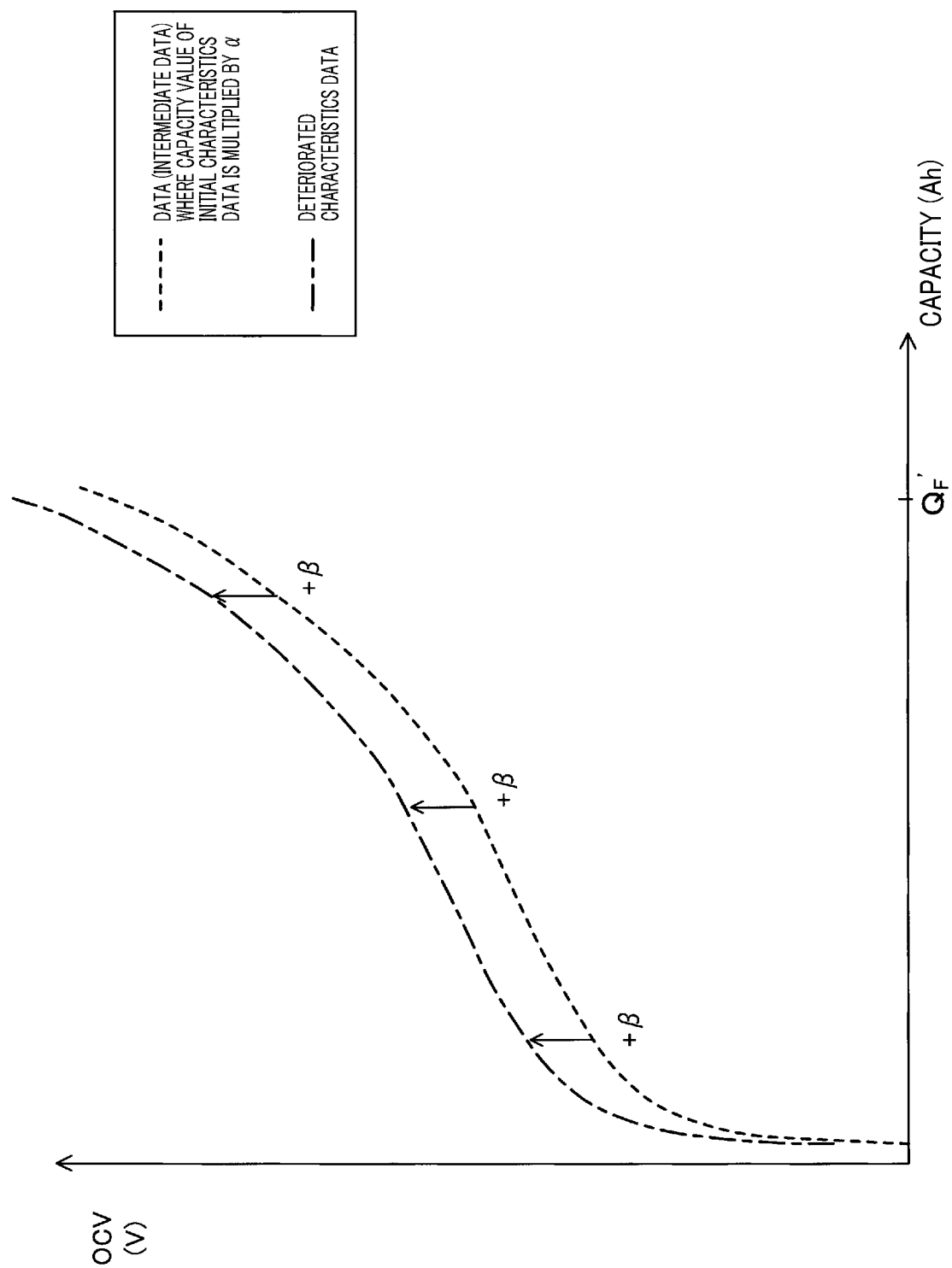
FIG. 2 is a graph showing data in which the capacity value of the initial characteristics data is multiplied by the capacity deterioration ratio α, and deteriorated characteristics data according to the first embodiment.

As shown in FIG. 2, the calculation unit 4 adds the offset quantity β to the OCV value of the intermediate data, after generating the above-described intermediate data. Thus, the relationship between the OCV and the capacity of the deteriorated secondary battery 2 (i.e. deteriorated characteristics data) is calculated. Note that the offset quantity β is an amount of variation of the OCV caused by deterioration of the active material contained in an electrode of the secondary battery 2.

In this manner, the deteriorated characteristics data can be accurately acquired. In other words, when the secondary battery 2 is deteriorated, the crystal structure of the active material changes so that lithium ions are unlikely to diffuse into the active material. Hence, the capacity of the secondary battery decreases. The decreasing rate of the capacity shows uniform over the entire SOC range. Hence, values in the entire curve of the initial characteristics data (see FIG. 1) are multiplied by the capacity deterioration ratio α, whereby a graph having the same curve as the deteriorated characteristics data (i.e. intermediate data) can be acquired. Further, the inventors of the present application have found out, through their keen research, that the OCV is offset over the entire curve when the secondary battery is deteriorated. Accordingly, the relationship between the OCV and the capacity (i.e. deteriorated characteristics data) can be accurately acquired by adding the above-described offset quantity β (see FIG. 2) to the above-described intermediate data.

Thus, after acquiring the deteriorated characteristics data, the capacity values included in the deteriorated characteristics data are divided by the fully charged capacity $Q_F'$ of the deteriorated secondary battery 2. As a result, the relationship between the OCV and the SOC of the deteriorated secondary battery (i.e. SOC characteristics data) is acquired.

Subsequently, a calculation method of the capacity deterioration ratio α and the offset quantity β will be described in more detail. As shown in FIG. 4, the calculation unit 4 calculates a change amount of the capacity when the OCV varies from the first voltage $V_A$ to the second voltage $V_B$ (hereinafter referred to as capacity change amount ΔQ) for the deteriorated secondary battery 2 as a deteriorated first capacity change amount $\Delta Q_1'$ which is measured using a current accumulation technique. Also, the calculation unit 4 calculates, by using the initial characteristic data, the capacity change amount ΔQ (initial first capacity change amount $\Delta Q_1$) when the OCV varies from the first voltage value $V_A$ to the second voltage $V_B$.

Subsequently, the calculation unit 4 calculates the capacity change amount ΔQ when the OCV varies from the second voltage $V_B$ to the third voltage $V_C$ for the deteriorated secondary battery 2 as a deteriorated second capacity change amount $\Delta Q_2'$ which is measured using the current accumulation technique. Further, the calculation unit 4 calculates, by using the initial characteristic data, the capacity change amount ΔQ (initial second capacity change amount $\Delta Q_2$) when the OCV varies from the second voltage value $V_B$ to the third voltage $V_C$. Thereafter, the capacity calculation unit 4 calculates the capacity deterioration ratio α and the offset quantity satisfying a condition where values of $|\Delta Q_1'-\Delta Q_1|$ and $|\Delta Q_2'-\Delta Q_2|$ are less than or equal to a specified value, by using the least squares method.

Figure 6:
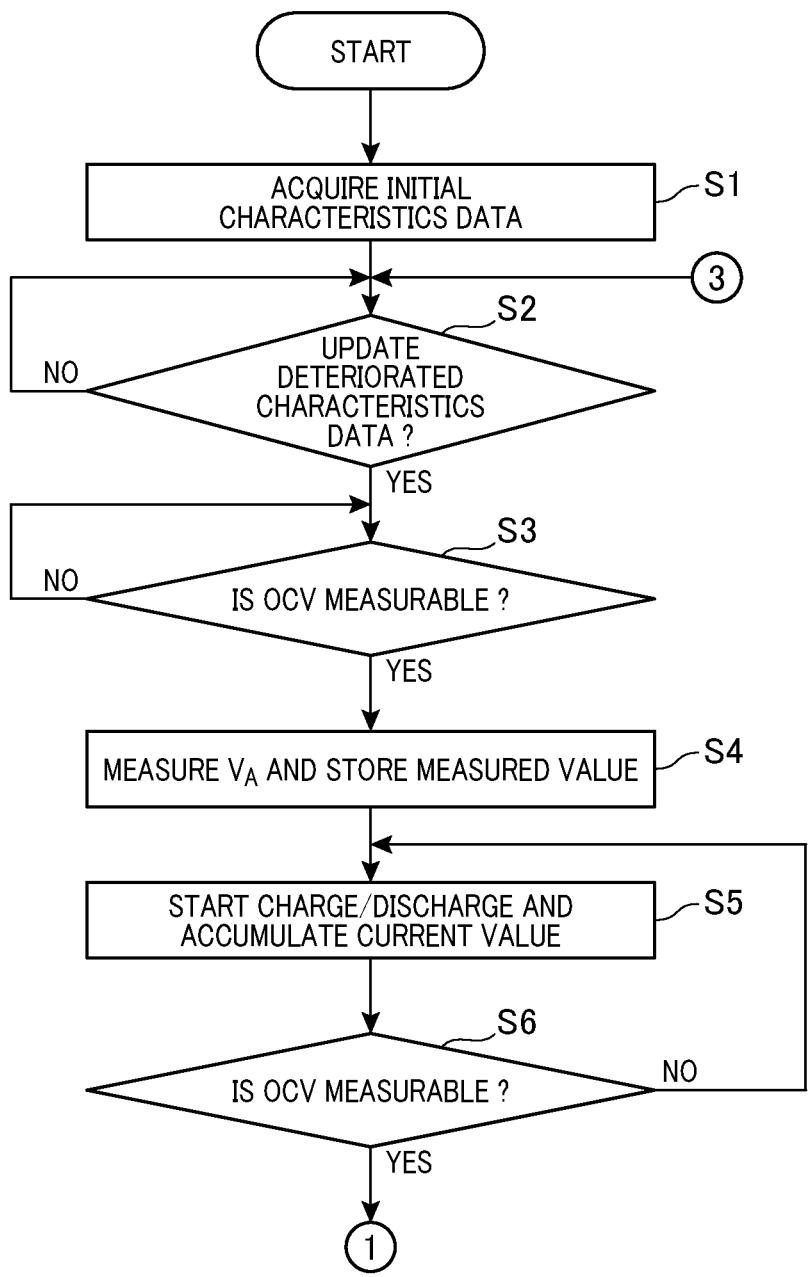
FIG. 6 is a flowchart showing processes executed by a calculation unit according to the first embodiment.
Figure 7:
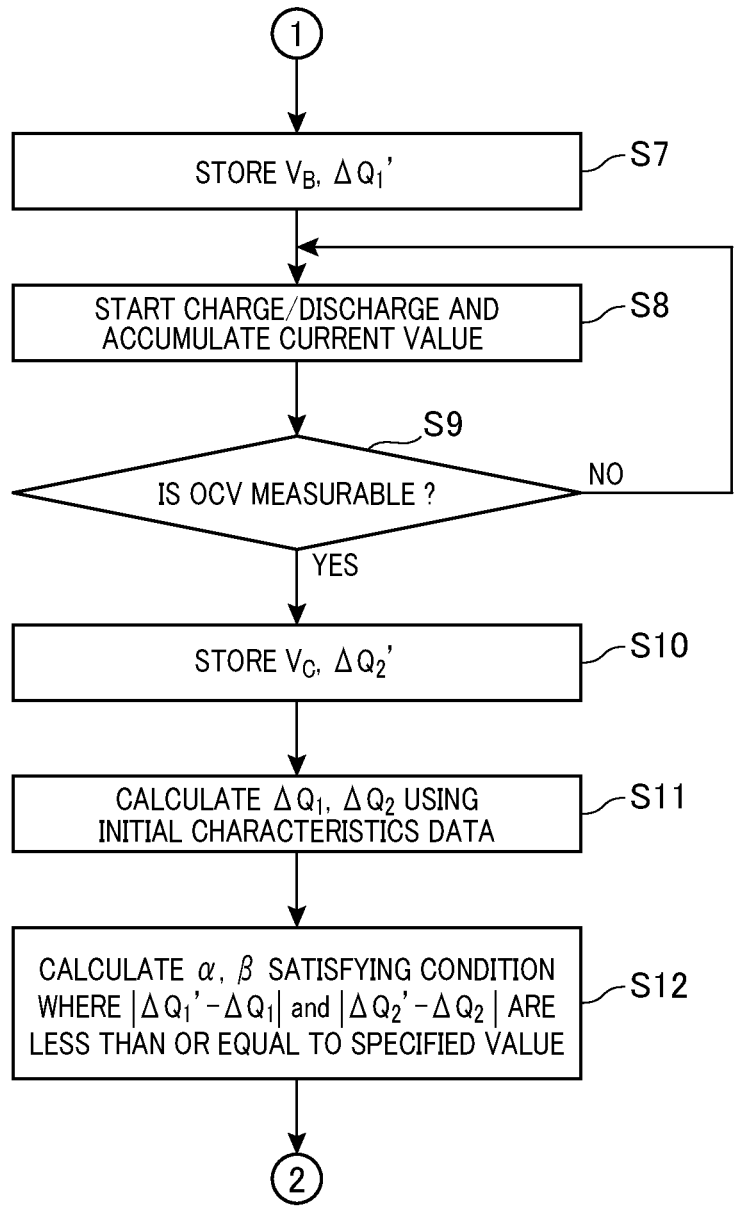
FIG. 7 is a flowchart subsequent to the flowchart shown in FIG. 6.
Figure 8:
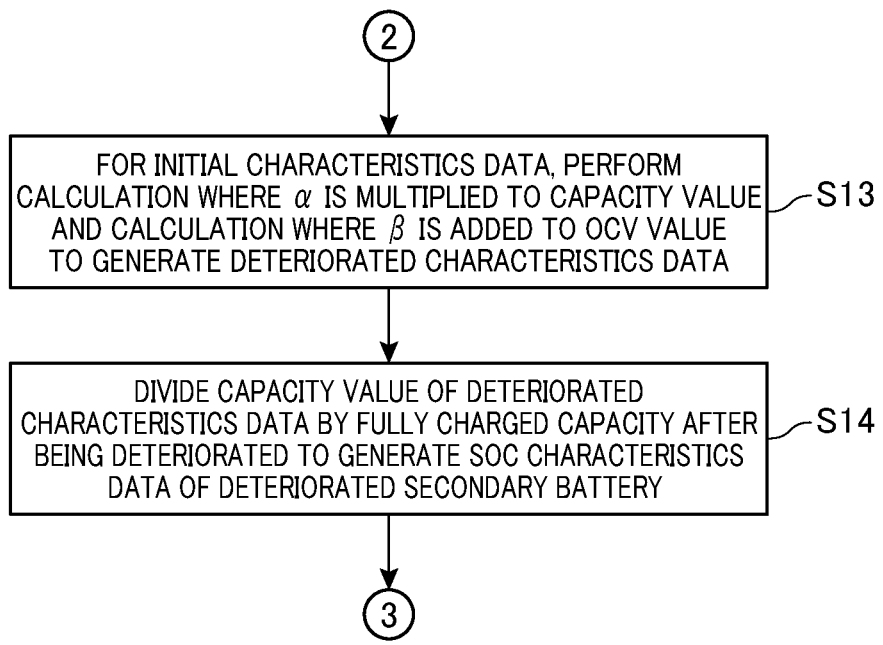
FIG. 8 is a flowchart subsequent the flowchart shown in FIG. 7.

Next, a flowchart of processes executed by the control unit 10 will be described. As shown in FIG. 6, the control unit 10 firstly executes step S1 after the secondary battery 2 is produced. Here, the process acquires a relationship between the OCV and the capacity of the secondary battery 2 before being deteriorated (i.e. initial characteristics data) and stores the acquired relationship data. Next, the process proceeds to step S2. At this step S2, the process determines whether it is necessary to update the deteriorated characteristics data. For example, in the case where a predetermined period has elapsed from when the deteriorated characteristics data is updated at previous cycle, the process determines that it is necessary to update (YES), and proceeds to step S3.

At step S3, the process determines whether it is possible to measure the OCV. At this step S3, for example, since the OCV cannot be accurately measured immediately after the secondary battery 2 is charged or discharged, the process determines as NO. Also, in the case where the secondary battery 2 has not been charged or discharged for a while, the process determines that the OCV can be measured (YES), and proceeds to step S4.

At step S4, the process measures the first voltage $V_A$ of the OCV (see FIG. 4) and stores the measured value. Thereafter, the process proceeds to step S5. At this step S5, the process starts charging/discharging and accumulates the current value. Next, the process proceeds to step S6 and determines whether the OCV can be measured. At this step S6, when the determination is YES, the process proceeds to step S7.

At step S7, the process measures the second voltage $V_B$ and the deteriorated first capacity change amount $\Delta Q_1'$ and stores the measured values. Thereafter, the process proceeds to step S8. At this step S8, the process starts the charging/discharging and accumulates the current value. Subsequently, the process proceeds to step S9 and determines whether the OCV can be measured. At this step S9, when the determination is YES, the process proceeds to step S10. At step S10, the process measures the third voltage $V_C$ and the deteriorated second capacity change amount $\Delta Q_2'$ and stores the measured value.

Then, the process proceeds to step S11. At step S11, the process calculates the initial first capacity change amount $\Delta Q_1$ and the initial second capacity change amount $\Delta Q_2$ by using the initial characteristics data. Then, the process proceeds to step S12 and calculates the capacity deterioration ratio α and the offset quantity β when values of $|\Delta Q_1'-\Delta Q_1|$ and $|\Delta Q_2'-\Delta Q_2|$ are less than or equal to a specified value, by using the least squares method.

Next, the process proceeds to step S13. At step S13, for the initial characteristics data, the process executes a calculation for the initial characteristic data in which the capacity value is multiplied by the capacity deterioration ratio α, and executes a calculation for the initial characteristic data in which the offset quantity β is added to the OCV. Thus, the deterioration characteristic data is generated.

Thereafter, the process proceeds to step S14. At the step S14, the capacity value of the deteriorated characteristics data is divided by the fully charged capacity $Q_F'$ of the deteriorated secondary battery 2. Thus, the SOC characteristics data of the deteriorated secondary battery 2 is generated.

Next, effects and advantages of the present embodiment will be described. As shown in FIG. 5, the power supply system 1 according to the present embodiment includes a calculation unit 4, and a SOC characteristics acquiring unit 5. The calculation unit 4 calculates a deteriorated characteristics data using the initial characteristics data. As shown in FIG. 3, the SOC characteristics acquiring unit 5 acquires a relationship between the OCV and the SOC of the secondary battery 2 using the deteriorated characteristics data. The initial characteristics data can be acquired for the entire SOC range (i.e. from 0% to 100%) before starting to use the secondary battery 2. Therefore, the initial characteristics data is utilized before starting to use the secondary battery 2, whereby accurate SOC characteristics data can be acquired for the entire SOC range.

Figure 14:
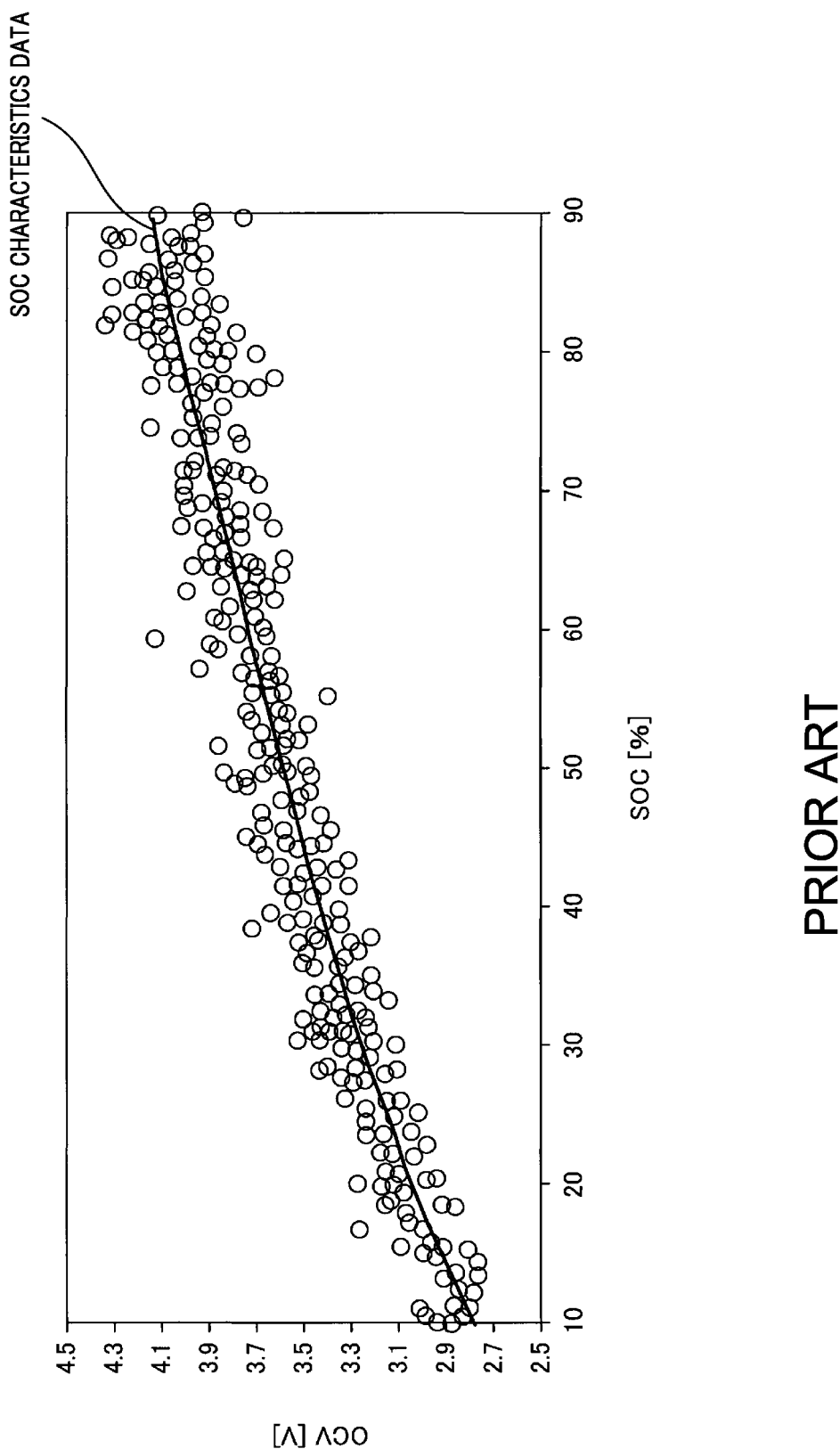
FIG. 14 is a graph showing a relationship between an OCV and a SOC of a deteriorated secondary battery according to a comparative embodiment.

As shown in FIG. 14, according to a conventional power supply system 1, a plurality of measurement values of the OCV and the SOC are acquired when the secondary battery 2 is operated. Then, SOC characteristics data is calculated using this measurement data. However, because of the usage of the secondary battery, the SOC is unlikely to be lower than or equal to 10% or larger than or equal to 90%. Hence, accurate SOC data is difficult to acquire in a range lower than or equal to 10% or in a range larger than or equal to 90%. In contrast, according to the present embodiment, as shown in FIGS. 1 and 2, since the SOC characteristics data is calculated using the initial characteristics data acquired before operating the secondary battery 2 (i.e. data in which SOC can be acquired in a range from 0% to 100%), accurate SOC characteristics data can be acquired for the entire SOC range.

Also, the calculation unit 4 according to the present embodiment performs a process for calculating the capacity deterioration ratio α and a process for calculating the offset quantity β. Then, the calculation unit 4 performs, for the initial characteristics data, a calculation where the capacity is multiplied by the capacity deteriorated rate α, and a calculation where the offset quantity β is added to the OCV, thereby calculating the deteriorated characterization data. Thus, the deterioration ratio of the capacity due to deterioration of the active material and a variation amount of the OCV can be reflected to the calculation of the deterioration characterization data. As a result, the deterioration characterization data can be accurately calculated and accurate SOC characterization data can be acquired.

As shown FIGS. 4 and 6 to 8, the calculation unit 4 measures the capacity change amount ΔQ for the deteriorated secondary battery 2, when the OCV varies from a predetermined value (first voltage $V_A$ according to the present embodiment) to another value (second voltage $V_B$ according to the present embodiment), and calculates the capacity change amount ΔQ using the initial characteristics data. Then, the calculation unit 4 uses these acquired capacity change amount ($\Delta Q_1'$, $\Delta Q_1$) to calculate the capacity deterioration ratio $\alpha$ and the offset quantity $\beta$. Thus, since the actual measurement value of the capacity change amount $\Delta Q$ of deteriorated secondary battery 2 is utilized, the capacity deterioration ratio $\alpha$ and the offset quantity $\beta$ can be accurately calculated.

More specifically, the calculation unit 4 according to the present embodiment uses the above-described the deteriorated first capacity change amount $\Delta Q_1'$, the initial first capacity change amount $\Delta Q_1$ and the initial second capacity change amount $\Delta Q_2$ to accurately calculate the capacity deterioration ratio $\alpha$ and the offset quantity $\beta$.

Note that OCV values ($V_A$, $V_B$, $V_C$) may be measured after the secondary battery 2 is sufficiently charged/discharged so as to make the capacity change amount $\Delta Q_1'$ and $\Delta Q_2'$ be larger than a predetermined value. Thus, the capacity deterioration ratio $\alpha$ and the offset quantity $\beta$ can be calculated more accurately.

Further, in the case where the capacity change amount $\Delta Q_1'$ and $\Delta Q_2'$ of the deteriorated secondary battery 2 are calculated, the capacity change amount $\Delta Q_1'$ and $\Delta Q_2'$ may be calculated by accumulating the amount of current only when a large amount of current which is larger than a measurement error of the current sensor 6A (see FIG. 5) flows from the secondary battery 2.

Moreover, the secondary battery 2 may be sufficiently discharged such that the difference between the first voltage $V_A$ and the second voltage $V_B$, and the difference between the second voltage $V_B$ and the third voltage $V_C$ are larger than a predetermined value. Thus, the capacity deterioration ratio $\alpha$ and the offset quantity $\beta$ can be calculated more accurately.

The difference between the first voltage $V_A$ and the second voltage $V_B$ and the difference between the second voltage $V_B$ and the third voltage $V_C$ may preferably be set to be larger than the measurement error of the voltage sensor $6_V$ (see FIG. 5). Thus, since the above-described voltage value can be sufficiently large, the capacity deterioration ratio $\alpha$ and the offset quantity $\beta$ can be calculated with sufficiently accurate.

According to the present embodiment, a power supply system capable of accurately acquiring SOC characteristics data through the entire range of the SOC.

In the following embodiments, elements having the same reference numbers as those in the first embodiment among the reference numbers used in the drawings indicate the same elements as those in the first embodiment unless otherwise specified.

Second Embodiment

Figure 9:
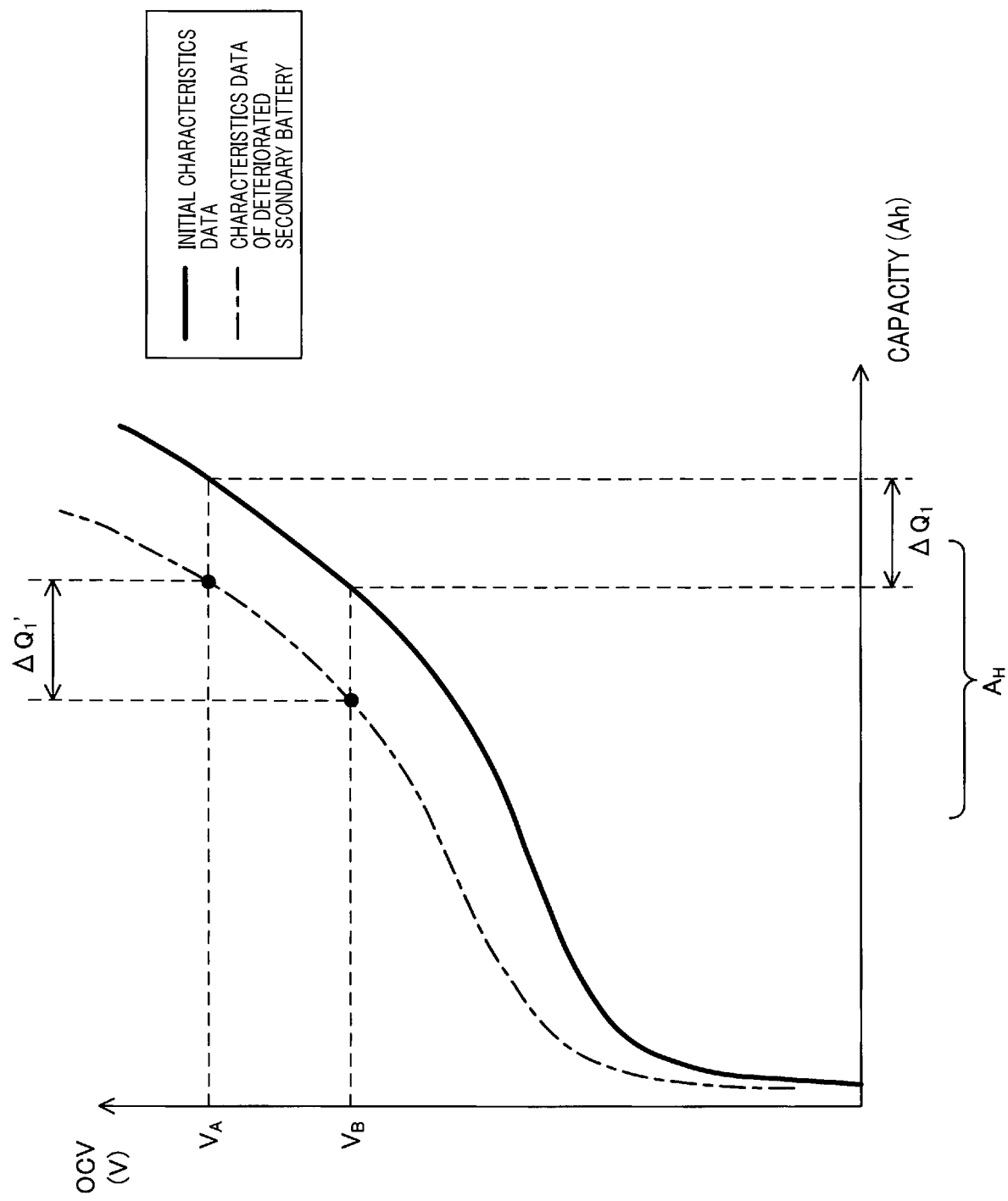
FIG. 9 is an explanatory diagram showing a method of calculating the capacity deterioration ratio α according to the second embodiment.

According to the second embodiment, calculation methods of the capacity deterioration ratio $\alpha$ and the offset quantity $\beta$ are modified. As shown in FIG. 9, in the present embodiment, similar to the first embodiment, the capacity change amount $\Delta Q$ when the OCV varies from the first voltage $V_A$ to the second voltage $V_B$ is calculated as the deteriorated first capacity change amount $\Delta Q_1'$ which is measured for the deteriorated secondary battery 2 and the initial first capacity change amount $\Delta Q_1$. Then, the capacity deterioration ratio $\alpha$ is calculated using the following equation 1.

$$\alpha = \Delta Q_1' / \Delta Q_1 \quad (1)$$

Figure 10:
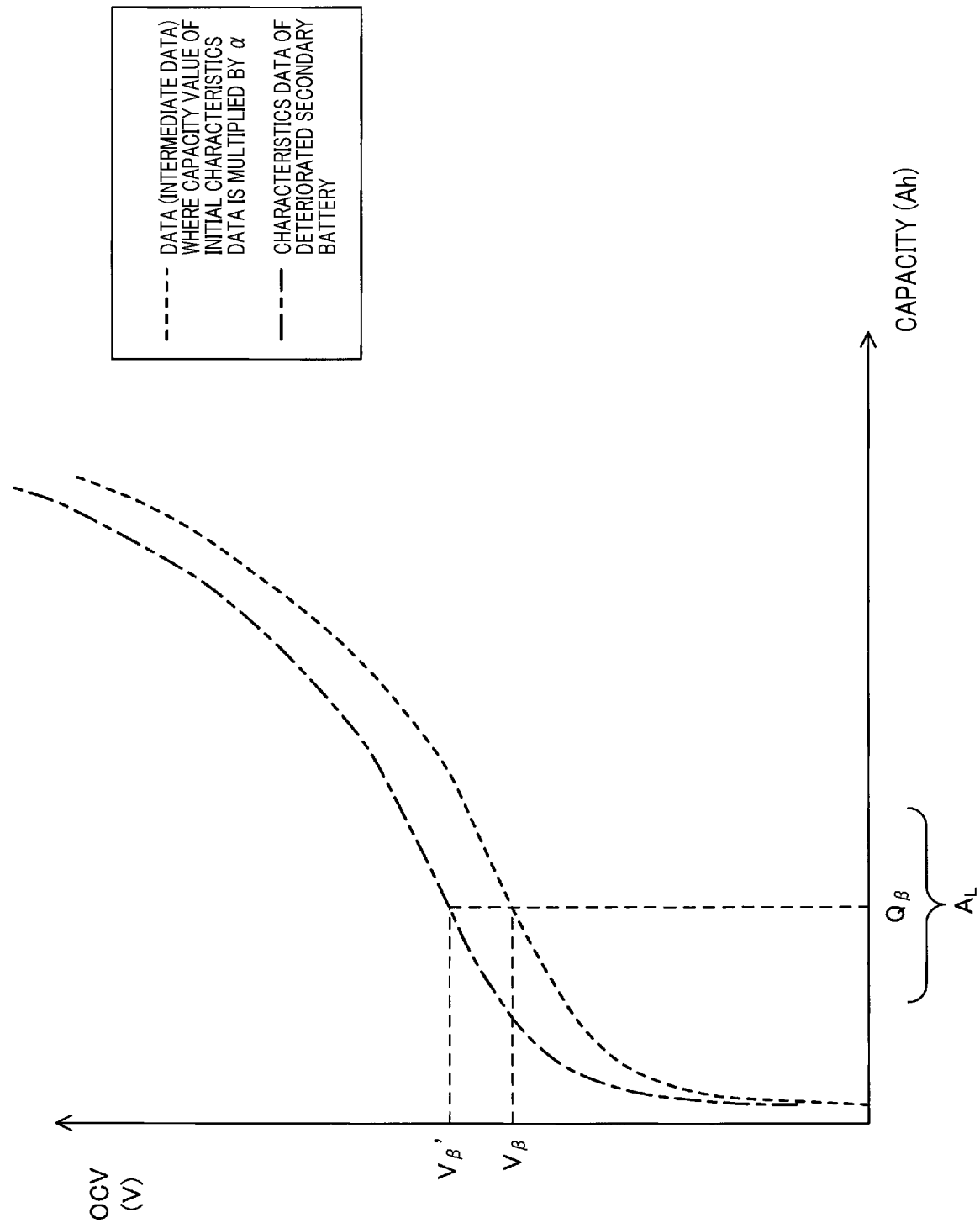
FIG. 10 is an explanatory diagram showing a method of calculating the offset quantity β according to the second embodiment.

Next, as shown in FIG. 10, for the OCV at the capacity of a predetermined value $Q_\beta$, a deteriorated open circuit voltage $V_\beta'$ which is measured for the deteriorated secondary battery 2 is acquired. The above-described capacity value $Q_\beta$ is set such that the deteriorated open circuit voltage $V_\beta'$ is different from both of the first voltage $V_A$ and the second voltage $V_B$.

Thereafter, an initial open circuit voltage $V_\beta$ as an OCV at the capacity of the predetermined value $Q_\beta$, by using data (intermediate data) acquired by multiplying the capacity deterioration ratio $\alpha$ to the capacity value of the initial characteristics data. Then, the offset quantity $\beta$ is calculated by using the following equation (2).

$$\beta = V_\beta' - V_\beta \quad (2)$$

Figure 11:
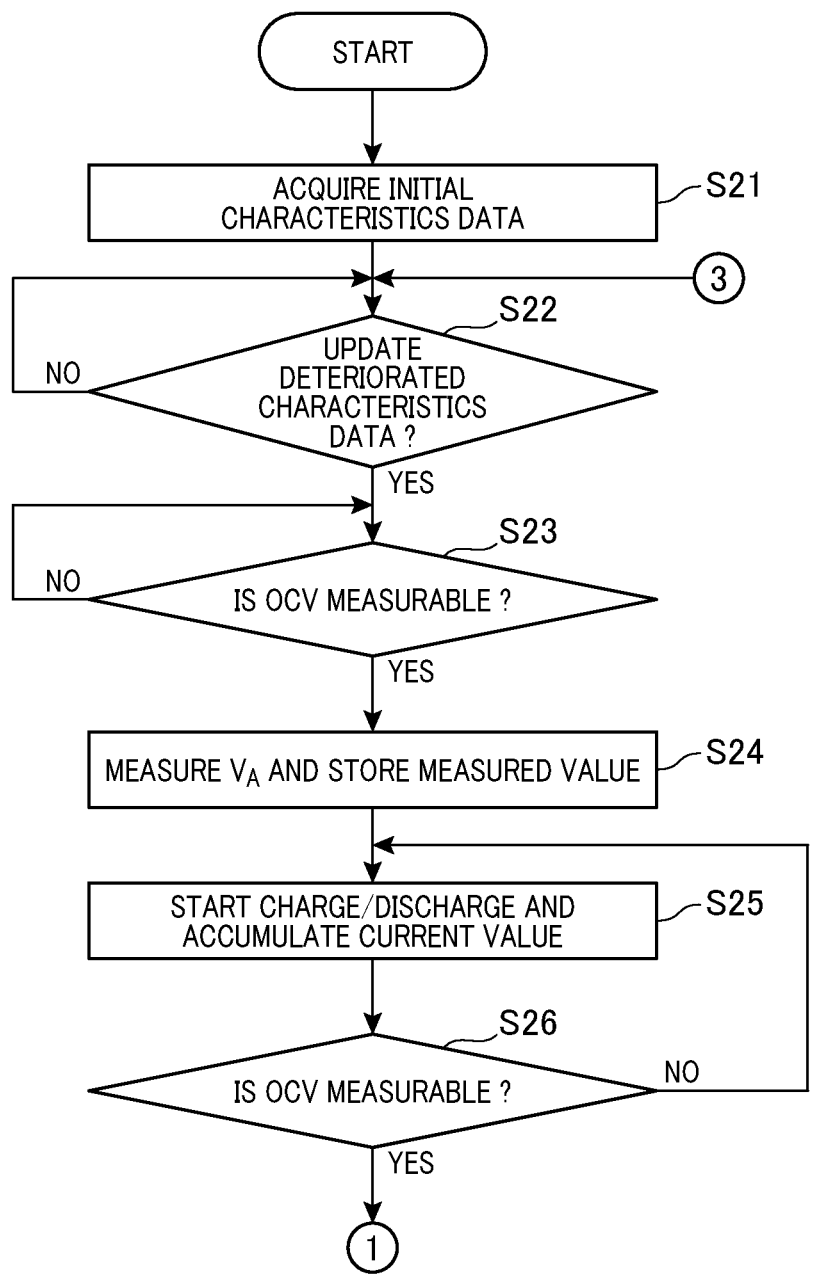
FIG. 11 is a flowchart showing processes executed by a calculation unit according to the second embodiment.
Figure 12:
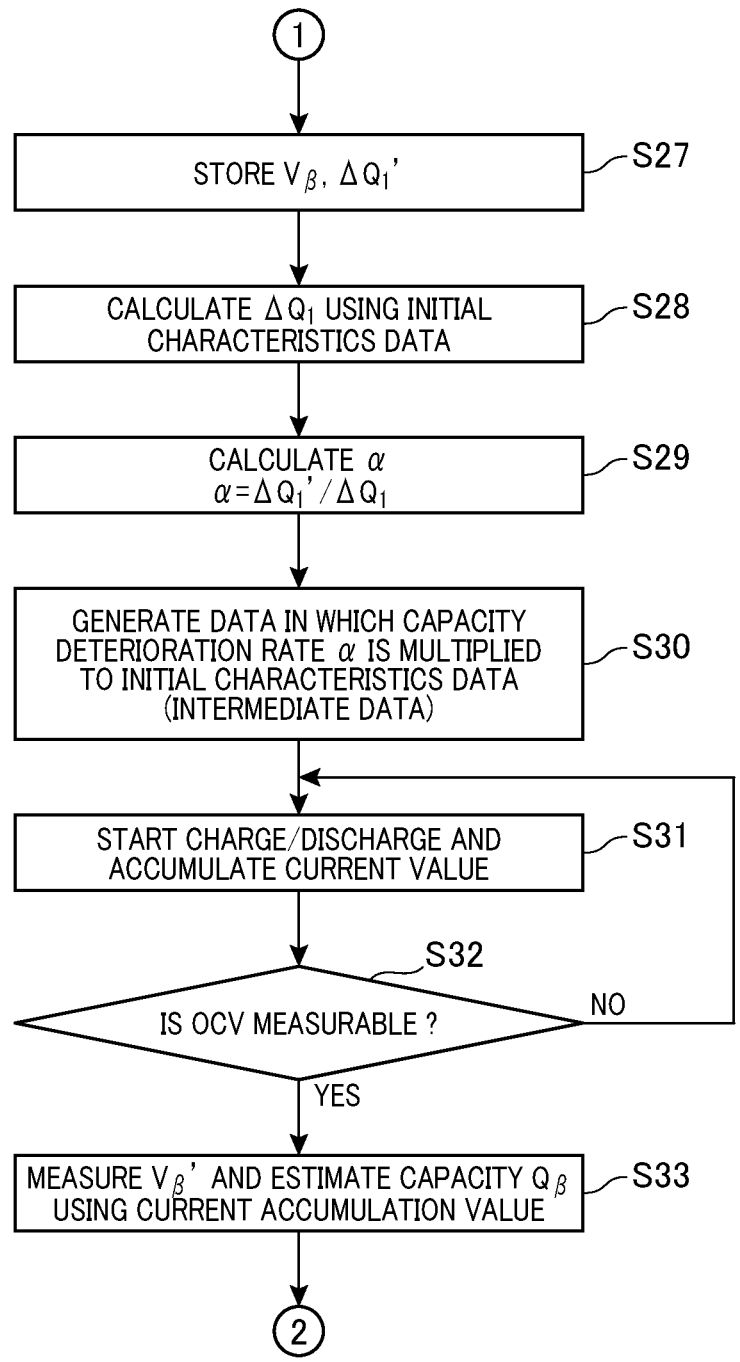
FIG. 12 is a flowchart subsequent to the flowchart shown in FIG. 11.
Figure 13:
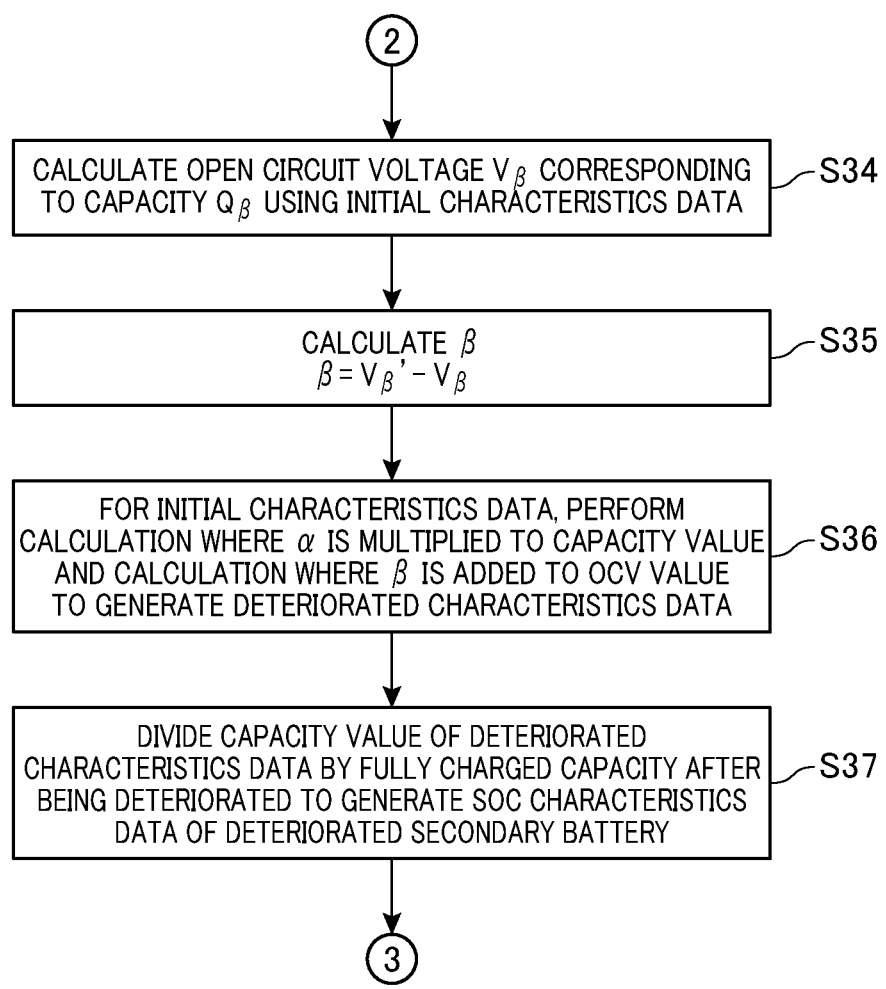
FIG. 13 is a flowchart subsequent to the flowchart shown in FIG. 12.

With reference to FIGS. 11 to 13, the flowchart of the present embodiment will be described. The control unit 10 executes processes at steps S21 to S26. Since these steps S21 to S26 are same as the steps S1 to S6, the explanation thereof will be omitted. Subsequently to step S26, the control unit 10 executes the process of step S27. At step S27, the process measures the second voltage $V_B$ and the deteriorated first capacity change amount $\Delta Q_1'$ and stores the measurement values.

Next at step S28, the process calculates, by using the initial characteristic data, the capacity change amount $\Delta Q$ (i.e. initial first capacity change amount $\Delta Q_1$) when the OCV varies from the first voltage value $V_A$ to the second voltage $V_B$. Subsequently, at step S29, the process calculates the capacity deterioration ratio $\alpha$ by using the above-described equation (1).

Next at step S30, the process generates a data in which the capacity value of the initial characteristics data (i.e. intermediate data) is multiplied by the capacity deterioration ratio $\alpha$. Thereafter, the process proceeds to step S31 at which the process starts charging/discharging operation of the secondary battery 2 and accumulates the current.

Thereafter, the process proceeds to step S32. At step S32, the process determines whether the OCV is measurable (i.e. whether or not sufficient time has elapsed from when charging/discharging operation of the secondary battery is stopped). When the determination at step S32 is YES, the process proceeds to step S33. At step S33, the process measures OCV value (V$\beta'$: see FIG. 10) and estimates the capacity $Q_\beta$ by using the current accumulation value.

Thereafter, the process proceeds to step S34. At step S34, the process calculates the OCV value V$\beta$ corresponding to the capacity $Q_\beta$ by using the initial characteristics data. Next, at step S35, the process calculates offset value $\beta$ by using the above-described equation (2).

Thereafter, the process proceeds to step S36. At step S36, the process performs a calculation for the initial characteristic data in which the capacity value is multiplied by the capacity deterioration ratio $\alpha$, and a calculation for the initial characteristic data in which the offset quantity $\beta$ is added to the OCV, thereby generating the deteriorated characteristics data. Subsequently, the process proceeds to step S37. At step S37, capacity value included in the deteriorated characteristics data is divided by the fully charged capacity $Q_F'$ after being deteriorated. Thus, the SOC characteristics data of the deteriorated secondary battery.

Next, effects and advantages of the present embodiment will be described. According to the present embodiment, the capacity deterioration ratio $\alpha$ and the offset quantity $\beta$ are calculated by using the above-described equations (1) and (2). Therefore, the capacity deterioration ratio $\alpha$ and the offset quantity $\beta$ can be acquired accurately.

According to the present embodiment, as shown in FIG. 9, the first voltage value $V_A$ and the second voltage $V_B$ are measured in a high variation region $A_H$ in which a change rate of the OCV with respect to the capacity is higher than a predetermined value (i.e. region having high gradient in the graph). Thus, the capacity deterioration ratio α can be calculated by using the region having high gradient in the graph. Hence, the capacity deterioration ratio α can readily be calculated accurately.

Also, according to the present embodiment, as shown in FIG. 10, the OCV values $V_β'$, $V_β$ and the capacity $Q_β$ are measured in a low variation region $A_L$ in which a change rate of the OCV with respect to the capacity is lower than a predetermined value (i.e. region having small gradient in the graph). Thus, even when the capacity $Q_β$ is slightly changed, the OCV values $V_β'$, $V_β$ do not significantly change. Hence, the offset quantity β can readily be calculated accurately. According to the present embodiment, constituents similar to that of the first embodiment, and effects and advantages similar to that in the first embodiment.

The present disclosure is not limited to the above-described embodiments, but may be applicable to various embodiments without departing from the spirit of the present disclosure.

What is claimed is:

1. A power supply system comprising:
a secondary battery;
a memory unit that stores initial characteristics data, the initial characteristics data being a relationship between an open circuit voltage and a capacity of the secondary battery before being deteriorated;
a calculation unit that calculates deteriorated characteristics data using the initial characteristics data, the deteriorated characteristics data being a relationship between the open circuit voltage and the capacity of a deteriorated secondary battery where the secondary battery is being deteriorated; and
a SOC characteristic acquiring unit that acquires a relationship between the open circuit voltage and a state of charge of the deteriorated secondary, by dividing the capacity of the deteriorated secondary battery included in the deteriorated characteristics data by a fully charged capacity of the deteriorated secondary battery.

2. The power supply system according to claim 1, wherein the calculation unit is configured to perform a process of calculating a capacity deterioration ratio in which the fully charged capacity of the deteriorated secondary battery is divided by the fully charged capacity of the secondary battery before being deteriorated, and a process of calculating an offset quantity of the open circuit voltage, the offset quantity being caused by deterioration of an active material contained in an electrode of the secondary battery; and
the calculation unit is configured to calculate the deteriorated characteristics data by performing calculations, for the initial characteristics data, in which the capacity of the secondary battery before being deteriorated is multiplied by the capacity deterioration ratio, and the offset quantity is added to the open circuit voltage.

3. The power supply system according to claim 2, wherein the calculation unit is configured to measure, for the deteriorated secondary battery, a change amount of the capacity when the open circuit voltage varies from a predetermined value to another value, and to calculate the change amount of the capacity for the secondary battery before being deteriorated by using the initial characteristics data, thereby calculating the capacity deterioration ratio using the acquired change amount of the capacity.

4. The power supply system according to claim 3, wherein the calculation unit is configured to calculate the capacity deterioration ratio and the offset quantity by using a deteriorated first capacity change amount, an initial first capacity change amount, a deteriorated second capacity change amount and an initial second capacity change amount,
the deteriorated first capacity change amount being measured, as a change amount of the capacity, for the deteriorated secondary battery when the open circuit voltage varies from a first voltage to a second voltage,
the initial first capacity change amount being calculated by using the initial characteristics data as a change amount of the capacity when the open circuit voltage varies from the first voltage to the second voltage,
the deteriorated second capacity change amount being measured as a change amount of the capacity for the deteriorated secondary battery when the open circuit voltage varies from the second voltage to a third voltage, and
the initial second capacity change amount being calculated by using the initial characteristics data, as a change amount of the capacity when the open circuit voltage varies from the second voltage to the third voltage.

5. The power supply system according to claim 3, wherein the calculation unit is configured to:
i) acquire the capacity change amount when the open circuit voltage varies from a first voltage to a second voltage, as a deteriorated first capacity change amount which is measured for the deteriorated secondary battery, and as an initial first capacity change amount which is calculated by using the initial characteristics data,
ii) calculate the capacity deterioration ratio in which the deteriorated first capacity change amount is divided by the initial first capacity change amount,
iii) acquire a deteriorated open circuit voltage measured for the deteriorated secondary battery, the deteriorated open circuit voltage being measured when the capacity of the secondary battery becomes a predetermined value, and acquire an initial open circuit voltage calculated using data in which the capacity of the initial characteristics data is multiplied by the capacity deterioration ratio, and
iv) calculate a difference between the deteriorated open circuit voltage and the initial open circuit voltage, thereby acquiring the offset quantity as the difference between the deteriorated open circuit voltage and the initial open circuit voltage.

* * * * *